United States Patent
Lee et al.

(10) Patent No.: US 6,884,650 B2
(45) Date of Patent: Apr. 26, 2005

(54) SIDE-BONDING METHOD OF FLIP-CHIP SEMICONDUCTOR DEVICE, MEMS DEVICE PACKAGE AND PACKAGE METHOD USING THE SAME

(75) Inventors: Eun Sung Lee, Daejeon (KR); Byeong-cheon Koh, Sungnam (KR); Chang-youl Moon, Suwon (KR); Kukjin Chun, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/703,587

(22) Filed: Nov. 10, 2003

(65) Prior Publication Data

US 2004/0106294 A1 Jun. 3, 2004

(30) Foreign Application Priority Data

Nov. 14, 2002 (KR) ................................ 10-2002-0070876

(51) Int. Cl.[7] ........................ H01L 21/00; H01L 23/48
(52) U.S. Cl. ........................... 438/51; 438/55; 438/108; 438/612; 257/415; 257/774; 257/780
(58) Field of Search ..................... 438/50–55, 108, 438/119, 612, 613; 257/414–420, 772–775, 778, 780, 782

(56) References Cited

U.S. PATENT DOCUMENTS 5,742,100 A * 4/1998 Schroeder et al. .......... 257/778
6,107,109 A * 8/2000 Akram et al. ................ 438/15
6,294,837 B1 * 9/2001 Akram et al. .............. 257/774
6,459,150 B1 * 10/2002 Wu et al. ................... 257/724

* cited by examiner

Primary Examiner—Kevin M. Picardat
(74) Attorney, Agent, or Firm—Lee, Sterba & Morse, P.C.

(57) ABSTRACT

A side-bonding method of a flip-chip semiconductor device, a MEMS device package and a package method using the same, in which firm bonding and insensitivity to surface roughness may be obtained, include forming a UBM on a bonding line of a lower substrate having a semiconductor device formed thereon, plating solder on the UBM on the lower substrate, forming a trench in the upper substrate to contact the lower substrate at a location corresponding to a location of the solder and forming a second UBM in the trench, coupling the upper substrate and the lower substrate by inserting the solder into the trench, and heating the upper substrate and the lower substrate at a temperature higher than a melting point of the solder so that the solder is wetted toward sides of the trench to bond the upper substrate and the lower substrate.

20 Claims, 5 Drawing Sheets

SIDE-BONDING METHOD OF FLIP-CHIP SEMICONDUCTOR DEVICE, MEMS DEVICE PACKAGE AND PACKAGE METHOD USING THE SAME

BACKGROUND

1. Field of the Invention

The present invention relates to a bonding method of a semiconductor device and a MEMS device package. More particularly, the present invention relates to a side-bonding method of a flip-chip semiconductor device for firmly bonding sides of the device, and a MEMS device package and a package method using the same.

2. Background of the Invention

The development of the package technology of bonding integrated devices is of considerable importance in miniaturization and high-performance of electronic goods. Therefore, the successful manufacturing of a microelectromechanical system (MEMS) device depends heavily on package technology, and particularly, wafer level package technology is of great importance in the mass production of MEMS devices.

Packaging of a MEMS device is essential for protecting the device in view of the device properties, even if the MEMS device itself has excellent size and performance properties. In the case of a wafer level package, with the exception of adhesive bonding, etc., two substrates to be bonded should be spaced apart by less than 0.1 $\mu$m, which may be a limitation in developing devices. In addition, bonding through a specific chemical reaction is highly affected by the conditions externally applied for the reaction, such as temperature, voltage, material property and the like, which results in a great impact on the device manufacturing processes.

The bonding method for a conventional MEMS device package includes anodic bonding, silicon direct bonding, eutectic bonding, adhesive bonding, and the like.

Figure 1:
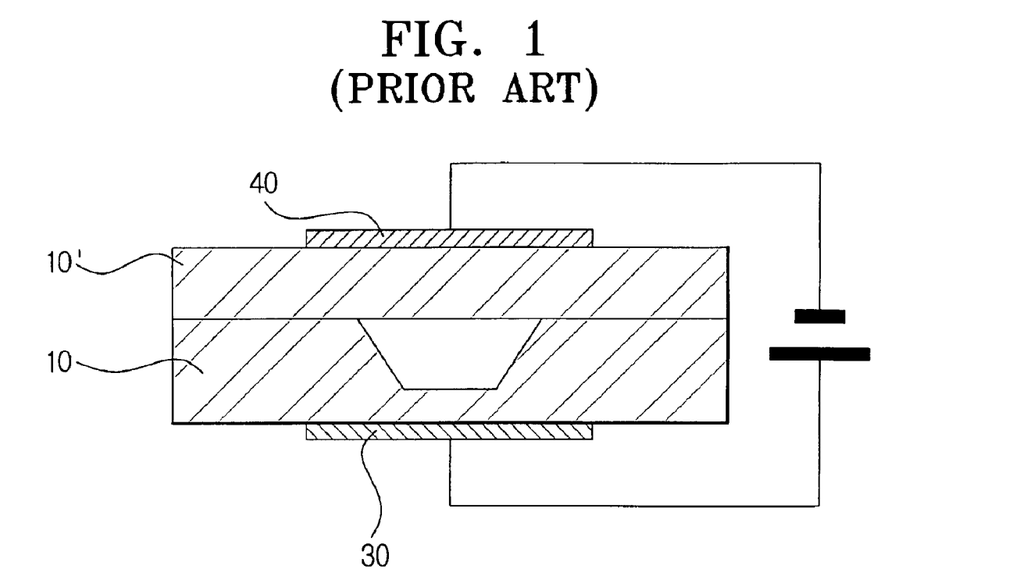
FIG. 1 illustrates a sectional view for showing anodic bonding.

FIG. 1 illustrates a schematic sectional view to show an example of anodic bonding. As shown in the FIG. 1, electrodes 30 and 40 are connected with upper and lower substrates 10, 10,' which are formed by depositing a silicon film or oxide film on a specific glass good. Thereafter, a voltage of 100 V or more is applied thereto to form an oxide film on the interface to achieve bonding. However, such a bonding method only works for a specific material having a glassy contact interface. Therefore, bonding may not be achieved depending on the roughness of the wafer surface by which a bonding yield is greatly affected by particles. In addition, because the bonding method requires 100 V or more to be applied to the device, device failures may occur on the MEMS device during the bonding. Furthermore, the bonding method requires a relatively very high processing temperature.

Figure 2:
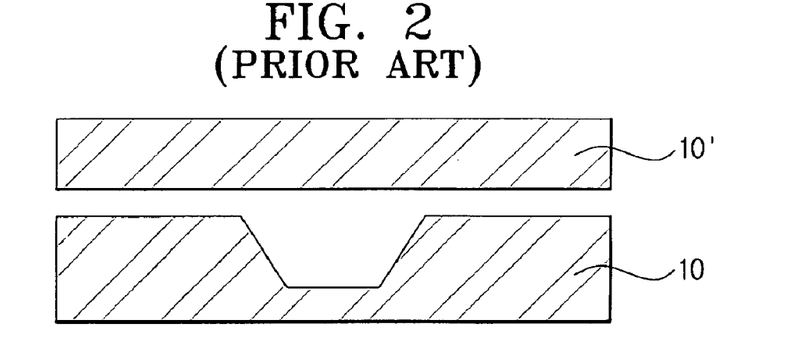
FIG. 2 illustrates a sectional view for showing silicon direct bonding.

FIG. 2 illustrates a schematic sectional view for showing an example of silicon direct bonding. As shown in the FIG. 2, silicon direct bonding for initial bonding is performed by heating upper and lower silicon substrates 10, 10' to a very high temperature to form a silicon oxide film thereon and to be bonded. Basically, silicon direct bonding requires surface treatment of a wafer and a very high processing temperature so that a silicon oxide film may be formed on the interface. Therefore, the bonding yield in silicon direct bonding is also affected by particles, and is more greatly affected by the surface roughness of the wafer than is anodic bonding.

Figure 3:
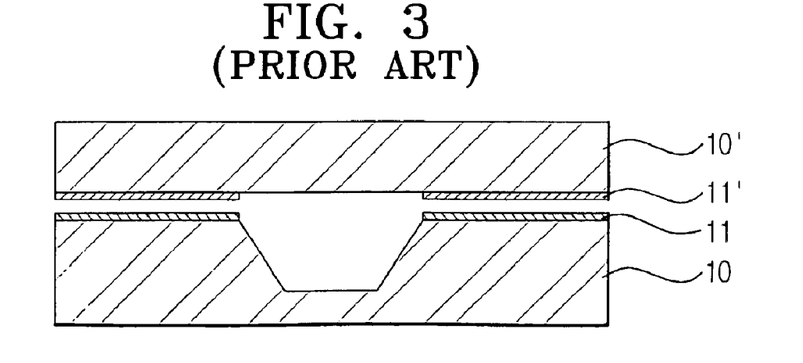
FIG. 3 illustrates a sectional view for showing eutectic bonding.

FIG. 3 illustrates a schematic sectional view to for showing an example of eutectic bonding. As shown in the FIG. 3, the bonding is performed by forming eutectic material 11, 11' on respective contact surfaces of upper and lower substrates 10, 10', and applying a pressure at a eutectic temperature or higher to effect the bonding. The bonding is achieved by forming a secondary film by a reaction occurring when the respective interfaces come into contact. Therefore, the surface state of the two wafers is of considerable importance.

Figure 4:
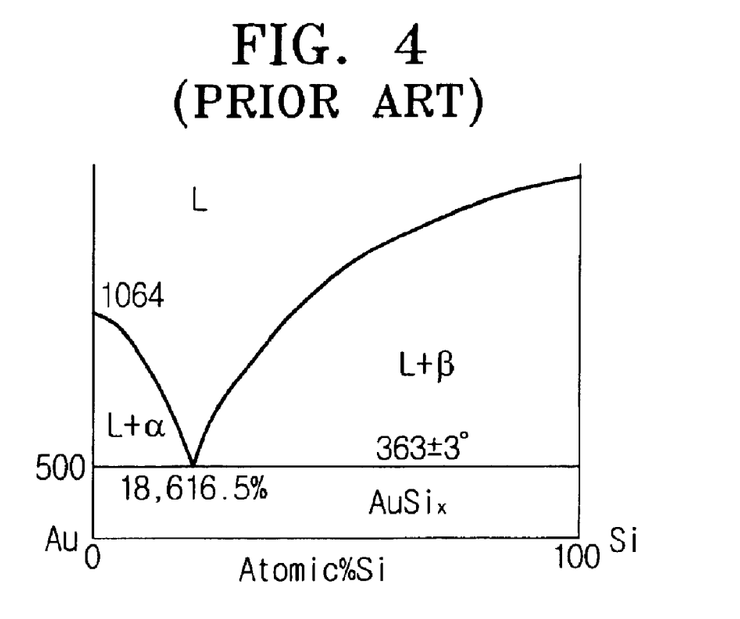
FIG. 4 is a graphical representation to illustrate the curve of eutectic phase change.

In addition, as shown in FIG. 4, a temperature required to effect a phase transition from a solid state to a liquid state varies depending on rations of elements involved. FIG. 4 is a graphical representation to illustrate the eutectic characterization curve of Au—Si. In the case that the ratio of the atomic weight of Si is about 18%, Au and Si can be phase-transitioned to a liquid state by mutual interaction at a temperature of about 363° C. This phase-transition temperature is much lower than the respective melting point of either element, but the phase-transition temperature may change greatly if the ratio of elements changes. Therefore, the bonding is extremely sensitive to the ratio control of atomic weight.

Figure 5:
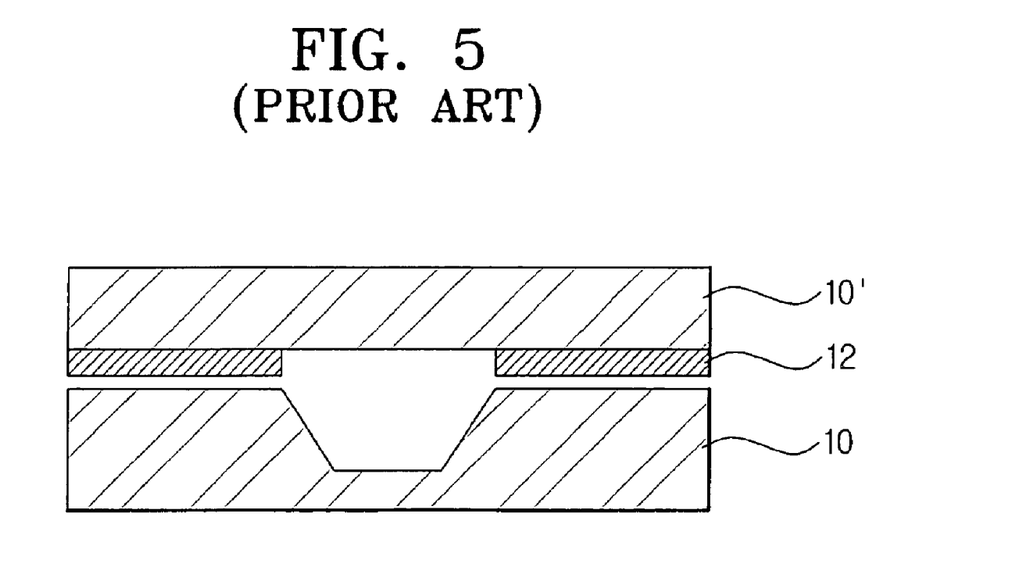
FIG. 5 illustrates a sectional view for showing adhesive bonding.

FIG. 5 illustrates a sectional view for showing adhesive bonding using an adhesive. As shown in FIG. 5, the bonding is performed by coating an adhesive 12 on a substrate 10', applying pressure and heating. In this case, solid state bonding is achieved by vaporizing a solvent inside the adhesive 12 during the bonding. Bonding methods that may be used include epoxy bonding, glass-frit bonding, solder paste bonding and the like.

However, a bonding layer comprised of the adhesive 12 is generally formed by screen printing or dispensing, making it difficult to control the shape of the adhesive, and resulting in a greatly increased pattern size. The roughness of a wafer created during the manufacturing of the MEMS device may be recovered, but the great increase in size of the bonding layer by the pressure causes a disadvantage. In addition, discharged gas that is generated by the solvent in the bonding material has an adverse affect on the MEMS device.

Figure 6:
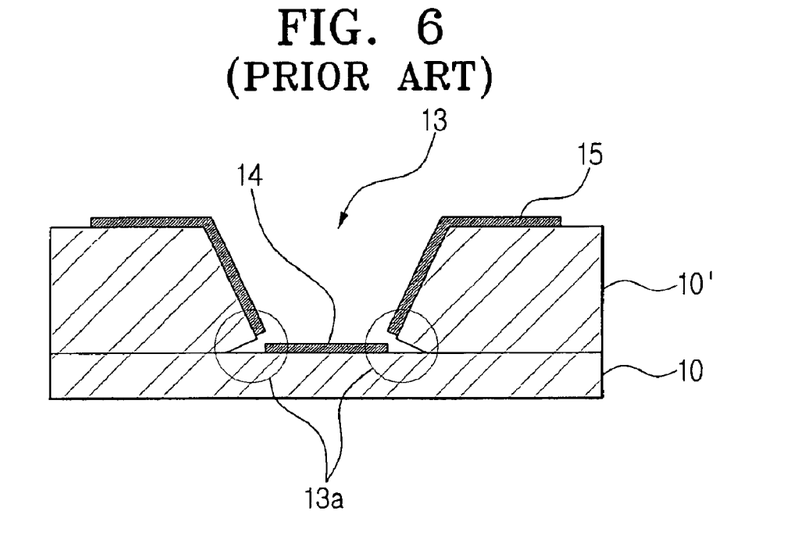
FIG. 6 illustrates a sectional view for showing a problem shown in an electrical interconnection through a via hole of a conventional MEMS device package.

Meanwhile, FIG. 6 illustrates a sectional view for showing a conventional method used to create an electrical interconnection through a via hole 13 in a conventional MEMS device package. As shown in FIG. 6, with the presence of several micrometers of an under-cut 13a formed during the formation of the via hole 13, electrically connecting an electrode 14 of a lower substrate 10 with circuits 15 of external terminals is a difficult problem.

SUMMARY OF THE INVENTION

The present invention addresses at least the problems and/or disadvantages described above, and provides at least the advantages described hereinafter.

Accordingly, it is a feature of an embodiment of the present invention to provide a method by which upper and lower substrates in a flip-chip semiconductor device such as a MEMS device package may be more firmly bonded and which is less sensitive to the surface states of the substrates.

It is another feature of an embodiment of the present invention to provide a MEMS device package and a package method using the above bonding method, in which the substrates are more firmly bonded and which is less sensitive to the surface states of the substrates.

The foregoing and other features and advantages may be realized by providing a side-bonding method of a flip-chip semiconductor device, including forming an under bump metalization (UBM) along a bonding line of a lower substrate having a semiconductor device formed thereon, plating solder on the UBM on the lower substrate, forming a trench in an upper substrate to contact the lower substrate at a location corresponding to a location of the solder and forming a second UBM in the trench, coupling the upper substrate and the lower substrate by inserting the solder into the trench, and heating the upper substrate and the lower substrate at a temperature higher than the melting point of the solder so that the solder is wetted toward sides of the trench to bond the upper substrate and the lower substrate.

The second UBM in the trench may be formed only on inner sidewalls of the trench.

The solder is preferably formed of a eutectic material having a melting point that is a predetermined number of degrees higher than a processing temperature of a process to be performed subsequent to the bonding process, is formed to have a high aspect ratio in the plating process, and is wetted toward the sides of the trench by being heated at a higher temperature than the melting point of the eutectic material, to be bonded.

Preferably, the bonding line and the trench corresponding thereto are formed to surround the semiconductor device formed on the lower substrate so that the semiconductor device is sealed by the bonding.

The method may further include forming a via hole through the upper substrate to allow external electrical connection to the semiconductor device. Additionally, the method may include forming a third UBM inside the via hole, and forming solder on a portion of the lower substrate corresponding to a location of the via hole in the upper substrate.

The bonding may further include inserting the solder into the via hole and wetting the solder toward sides of the via hole during the bonding of the upper substrate and the lower substrate.

The method may further include performing an electroless plating by employing the third UBM in the via hole as a seed of the electroless plating so as to fill the via hole.

According to another feature of an embodiment of the present invention, a MEMS device package includes a lower substrate having a MEMS device formed thereon, and an upper substrate bonded to the lower substrate to cover the MEMS device, wherein the upper substrate includes a trench formed in a contact surface thereof along a bonding line with the lower substrate, the trench having a first UBM formed therein, and a cavity formed in the contact surface so that the MEMS device on the lower substrate is located therein, and wherein the lower substrate includes a second UBM formed on a contact surface thereof along the bonding line in a location corresponding to the trench of the upper substrate, and solder formed on the second UBM and melted in the trench by heating to be bonded.

The upper substrate may further include a via hole formed therethrough for allowing external electrical connection to the MEMS device. The lower substrate may further include a third UBM formed thereon in a location corresponding to the via hole, and solder formed on the third UBM. A fourth UBM may be formed inside the via hole, and the solder formed on the third UBM may be wetted toward sides of the via hole and bonded by heating.

According to another feature of an embodiment of the present invention, the is provided a method of forming a MEMS device package including a lower substrate having a MEMS device formed thereon, and an upper substrate being coupled with the lower substrate to cover the MEMS device, including forming a via hole through the upper substrate, and a trench in a contact surface of the upper substrate along a bonding line with the lower substrate, forming a first UBM on the via hole and the trench, respectively, forming a second UBM on portions of the lower substrate corresponding to respective locations of the via hole and the trench, plating solder on the second UBM to have a predetermined thickness, inserting the solder into the via hole and the trench, respectively, so as to couple the upper substrate and the lower substrate, and heating the coupled upper substrate and lower substrate so that the solder is melted and bonded.

The method of forming a MEMS device package may further include interconnecting the MEMS device through the via hole, and performing an electroless plating by employing the second UBM of the via hole as a seed of the electroless plating so as to fill the via hole.

Preferably, the trench is formed to have a depth such that the solder is completely inserted into the trench. The first UBM is preferably formed on the via hole and the trench, respectively, such that the solder is wetted toward sides of the via hole and trench, respectively, in the bonding process. The second UBM formed on the portions of the lower substrate is preferably formed to have a width greater than the respective opening of the via hole and the trench. The solder is preferably formed of a eutectic material having a melting point higher than a processing temperature of a process to be performed after the bonding process. The solder is preferably formed to have a high aspect ratio in the plating process. A heating temperature of the bonding process is preferably higher than a eutectic temperature of the solder.

The trench is preferably formed to have a depth such that the solder is completely inserted into the trench.

The UBM formed on the lower substrate is preferably formed to have a width greater than the respective opening of the via hole and the trench.

The bonding method of the present invention preferably includes the step of performing an electroless plating by employing the UBM of the via hole as a seed of the electroless plating so as to fill the via hole.

Additional features and advantages of the present invention will be set forth in part in the description which follows.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-70876, filed on Nov. 14, 2003, and entitled: "Side-Bonding Method Of Flip-Chip Semiconductor Device, Mems Device Package And Package Method Using The Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

The following detailed description will present preferred embodiments of a side-bonding method of a flip-chip semiconductor device, a MEMS device package and a package method using the same according to the present invention.

Figure 7:
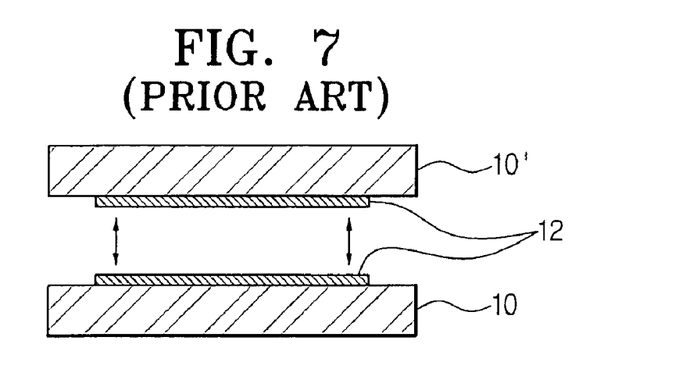
FIG. 7 illustrates a sectional view for showing the up-and-down bonding property used in bonding a conventional MEMS device package.
Figure 8:
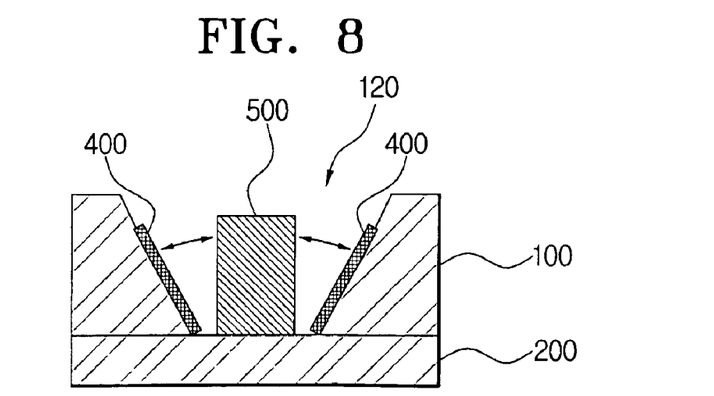
FIG. 8 illustrates a sectional view for showing the right-and-left side-bonding property used in bonding a MEMS device package according to the present invention.

FIG. 8 illustrates a sectional view for showing a right-and-left side-bonding property used in bonding a MEMS device package according to the present invention, while FIG. 7 illustrates a sectional view for showing an up-and-down bonding property used in bonding a conventional MEMS device package.

Figure 9A:
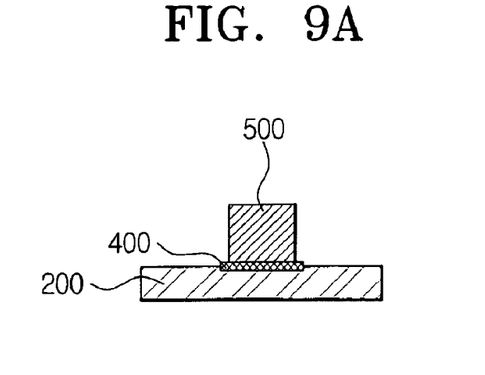
FIGS. 9A and 9B illustrate schematic views for showing a reflow property of a solder.
Figure 9B:
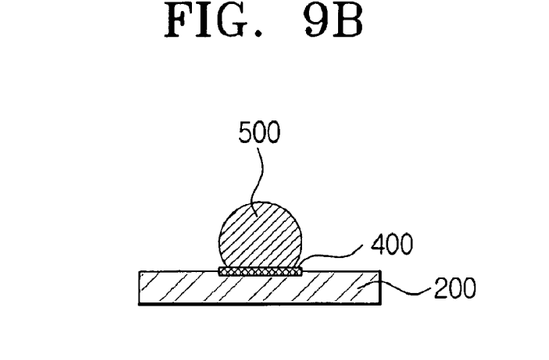

FIGS. 9A and 9B illustrate schematic views for showing a reflow property when solder is heated according to the present invention. In FIG. 9A, an under bump metalization (UBM) 400 is formed of a wetting material on a lower substrate 200. Solder 500 is formed on the wetting UBM 400. The solder 500 is melted at a predetermined temperature as shown in FIG. 9B, and is reformed to have a tendency toward reducing its surface energy. That is, the solder 500 is reflowed as a ball shape over the wetting UBM 400, the ball shape of the solder 500 shown in FIG. 9B representing the lowest surface energy.

FIGS. 10A to 10D illustrate views of a MEMS device package and a package manufacturing process according to an embodiment of the present invention.

Figure 10A:
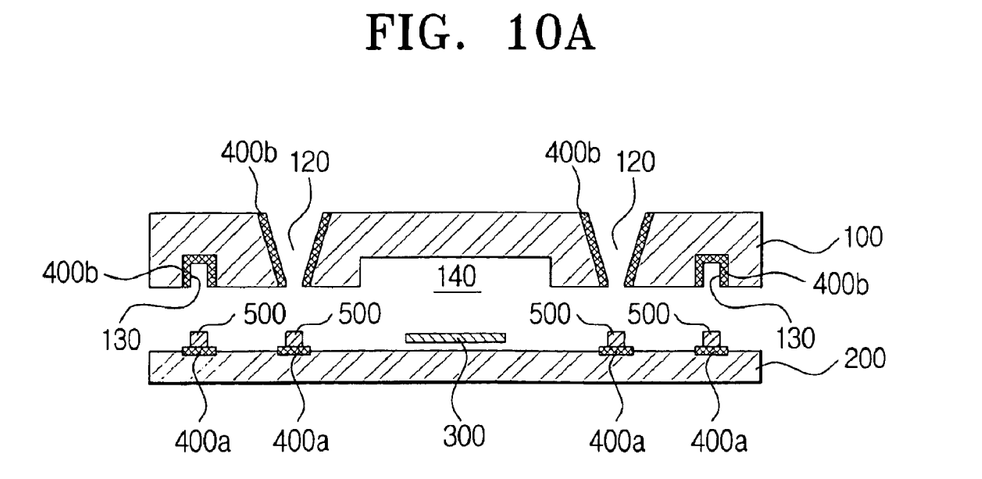
FIGS. 10A to 10C illustrate sectional views for showing a bonding process of a MEMS device package according to the present invention.

As shown in FIG. 10A, a MEMS device package according to an embodiment of the present invention is configured to include an upper substrate 100 having a via hole 120 and a trench 130, and a lower substrate 200 having a MEMS device 300 and solder 500. Contact surfaces of the upper substrate 100 and the lower substrate 200 face each other along a bonding line thereof.

The via hole 120 is a through hole penetrating the upper substrate 100, and is used to electrically connect the MEMS device 300 outside the device.

The trench 130 is formed on the contact surface of the upper substrate 100 along the bonding line with the lower substrate 200. The trench 130 is a groove having a predetermined depth, which is preferably deeper than a height of the solder 500 so that the solder 500 can be inserted into the trench 130. The trench 130 is preferably formed to surround the overall MEMS device to thereby isolate the MEMS device from outside the device during subsequent processes such as dicing and the like.

A UBM 400b is formed inside the via hole 120 and the trench 130 only, to provide a wetting property for the solder 500. The UBM 400b is preferably formed to have a predetermined height from the sides of the via hole 120 and a bottom and sides of the trench 130.

A cavity 140 is formed on the contact surface of the upper substrate 100 with a predetermined size so that the MEMS device 300 formed on the lower substrate 200 may be located therein.

A UBM 400a is formed of a wetting material on portions of the lower substrate 200 to correspond to the via hole 120 and the trench 130 on the upper substrate 100. The UBM 400a is preferably formed to have an appropriate size according to a final bonding force depending on a width and an adhesive force of the wetting material. The solder 500 is formed on the wetting material of the UBM 400a. The solder 500 is preferably formed to have an appropriate size to be inserted into and fit in the via hole 120 and the trench 130, and to have a width that is controlled to not interfere with subsequent processes, such as alignment during insertion and the like. The solder 500 is preferably formed of a eutectic material having a melting point that is 50° C. higher than a subsequent processing temperature. In addition, the solder 500 is formed by a plating process to have a high aspect ratio.

The upper substrate 100 and the lower substrate 200, configured as above, are coupled and bonded with each other to form a MEMS device package.

Figure 10B:
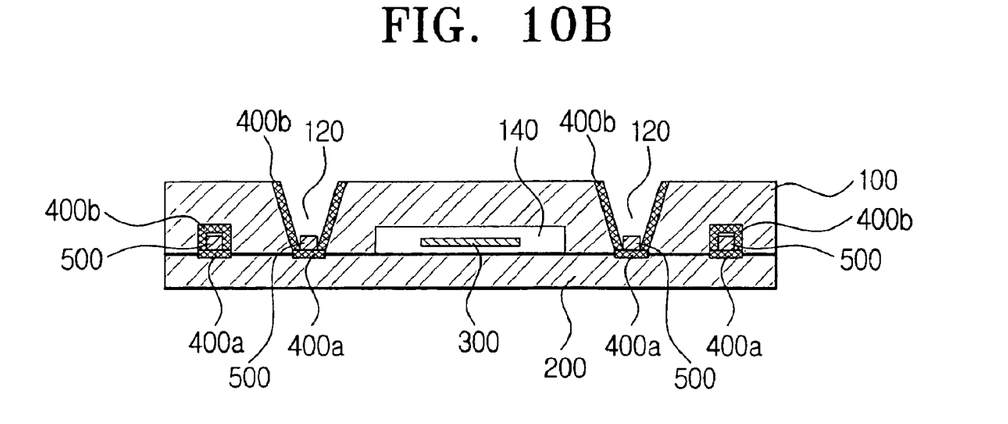
Figure 10C:
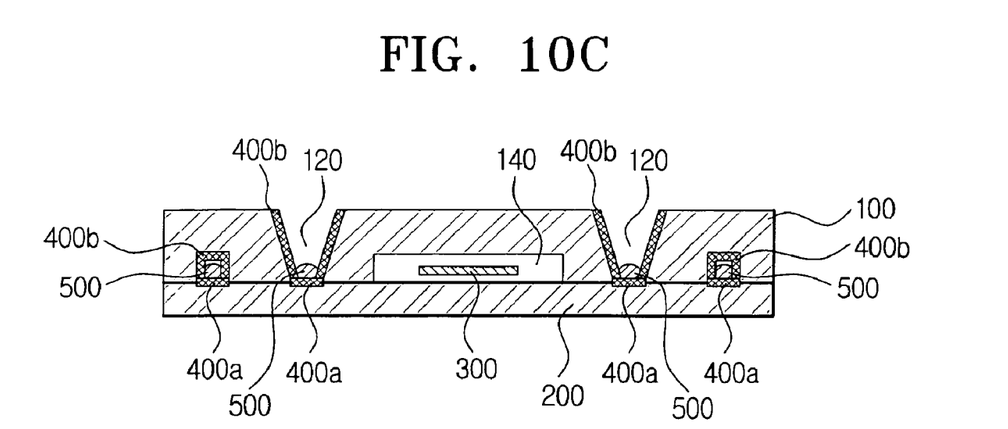

FIGS. 10B and 10C illustrate views depicting a bonding process of the MEMS device package according to the present invention. The solder 500 is inserted into the via hole 120 and the trench 130 of the upper substrate 100 as shown in FIG. 10B. The MEMS device 300 formed on the lower substrate 200 is placed into the cavity 140 of the upper substrate 100.

Then, the MEMS device package is heated at a temperature high enough to melt the solder 500, as shown in FIG. 10C, and higher than the eutectic temperature of the eutectic material which forms the solder 500. The solder 500 is melted and reflowed to have a ball shape as shown in FIG. 9B. However, the shape of the melted solder 500 depends on the shape of the wetting UBM 400, and the reflow state is also varied with the wetting UBM 400.

The solder 500 is reformed toward the sides along the UBM 400 when it is inserted and melted into the via hole 120 and the trench 130 as shown in FIG. 10C. Accordingly, the solder 500 is inserted in a "Lego™ like" assembly and wetted toward the sides of the via hole 120 and the trench 130. Therefore, the bonding and sealing does not depend on the surface state and roughness of the upper and lower substrates, or the uniformity of the solder. When the trench 130 completely surrounds the MEMS device, hermetic sealing of the MEMS device may be achieved.

If a eutectic material is employed as the solder, the heating temperature may be reduced, and damage to the MEMS device or IC circuits due to high temperatures may be prevented. However, it is preferable to use a material having a melting point that is 50° C. higher than the processing temperature of subsequent processes, such as chip on bit (COB) and the like, to prevent the bonding from being damaged or broken in the following processes, particularly when the bonded device is employed in a chip package which is required in the following processes.

The wafer bonding method according to the present invention as described above is a package method that is minimally sensitive to surface states of the substrates. Further, if a range of step heights from several micrometers to several tens of micrometers exists, the package is not adversely affected.

In addition, the present invention may be employed on a flip-chip bonding of a final COB, as well as in a wafer level package of a MEMS device as described above. That is, it is possible to perform flip-chip bonding by the method of the present invention by corresponding the upper substrate and the lower substrate described above to a chip device and a board, or a board and a chip device, and forming a trench and a UBM on the board and the chip device so that solder is inserted and bonded.

FIG. 6 illustrates a sectional view depicting a conventional method of electrically connecting a device outside the MEMS device package through a via hole 13. As shown in the FIG. 6, with the presence of the via hole 13 and several micrometers of under-cut 13a, the electrode 14 of the lower substrate 10 and the circuits 15 of the external terminal are not electrically connected through the via hole 13.

In contrast, the MEMS device package of the present invention, as shown in FIGS. 8, 10B and 10C, is formed by inserting the solder 500 into the via hole 120, reflowing the solder 500, and bonding the sides. Therefore, a problem of disconnection due to an under-cut does not occur, and difficulty in forming the via hole for electrical connection may be solved.

Figure 10D:
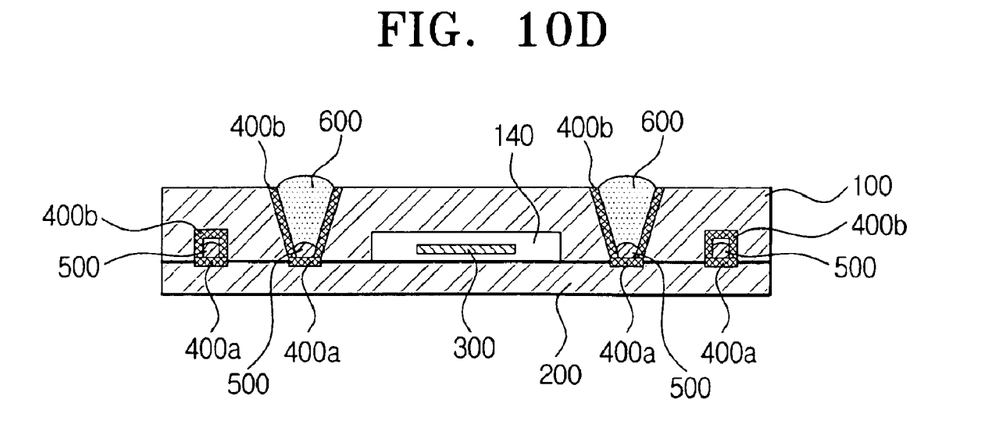
FIG. 10D illustrates a sectional view for showing an electroless plating process for an electrical connection outside the device package after the bonding process of FIGS. 10A to 10C.

In the meantime, in the case of filling electrical circuits into the via hole 120, the wetting material of the UBM 400b may be chosen as a material to be used as a seed of electroless plating. In such a case, a plating film 600 is grown from the seed 400b and the solder 500 through the electroless plating after bonding, to thereby fill the via hole 120 as shown in FIG. 10D.

Accordingly, in the bonding method of a flip-chip semiconductor device according to the present invention, right-and-left side bonding is achieved when bonding the upper and lower substrates, as opposed to up-and-down bonding of a conventional method, by using the structures of a via hole, a trench, and a UBM, and the coupling and bonding technology of solder. Therefore, the bonding method according to the present invention is advantageously insensitive to the roughness of the upper and lower substrates and, by making the depth of the trench deeper than the height of the solder, to the thickness uniformity of the solder plating.

The bonding method of the present invention has no electrical impulse and little impact on IC circuits because it is processed at a relatively low processing temperature unlike conventional bonding methods, which are processed at high temperatures and pressures. In addition, the bonding method of the present invention provides for minimization of a chip size because an electrical interconnection through a via hole is possible, and may be usefully employed on a wafer level MEMS device package.

The bonding method of the present invention also allows welding sealing and vacuum sealing because there is little discharged gas during the bonding by using a solder plating without a solvent depending on the material of the substrates.

Finally, the aforementioned advantages of the bonding method of the present invention make it exceptionally compatible with various MEMS device-related processes that involve a wafer level package and a vacuum sealing area and in which controlling the roughness of a surface state is difficult.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A side-bonding method of a flip-chip semiconductor device, the method comprising:
   a) forming an under bump metalization (UBM) on a bonding line of a lower substrate having a semiconductor device formed thereon;
   b) plating solder on the UBM on the lower substrate;
   c) forming a trench in an upper substrate to contact the lower substrate at a location corresponding to a location of the solder and forming a second UBM in the trench;
   d) coupling the upper substrate and the lower substrate by inserting the solder into the trench; and
   e) heating the upper substrate and the lower substrate at a temperature higher than a melting point of the solder so that the solder is wetted toward sides of the trench to bond the upper substrate and the lower substrate.

2. The method as claimed in claim 1, wherein in (c), the second UBM in the trench is formed only on inner sidewalls of the trench.

3. The method as claimed in claim 1, wherein the solder is comprised of a eutectic material having a melting point that is a predetermined number of degrees higher than a processing temperature of a process to be performed subsequent to the bonding in (e), is formed to have a high aspect ratio in the plating in (b), and is wetted toward the sides of the trench by being heated at a higher temperature than the melting point of the eutectic material to be bonded in (e).

4. The method as claimed in claim 1, wherein the bonding line and the trench corresponding thereto are formed to surround the semiconductor device formed on the lower substrate so that the semiconductor device is sealed by the bonding in (e).

5. The method as claimed in claim 1, further comprising:
   forming a via hole through the upper substrate to allow external electrical connection to the semiconductor device.

6. The method as claimed in claim 5, further comprising:
   forming a third UBM inside the via hole; and
   forming solder on a portion of the lower substrate corresponding to a location of the via hole in the upper substrate.

7. The method as claimed in claim 6, wherein the bonding in (e) further comprises inserting the solder into the via hole and wetting the solder toward sides of the via hole during the bonding of the upper substrate and the lower substrate.

8. The method as claimed in claim 6, further comprising performing an electroless plating by employing the third UBM in the via hole as a seed of the electroless plating so as to fill the via hole.

9. A MEMS device package comprising:

a lower substrate having a MEMS device formed thereon; and an upper substrate bonded to the lower substrate to cover the MEMS device, wherein the upper substrate includes:

a trench formed in a contact surface thereof along a bonding line with the lower substrate, the trench having a first UBM formed therein; and a cavity formed in the contact surface so that the MEMS device on the lower substrate is located therein; and wherein the lower substrate includes:

a second UBM formed on a contact surface thereof along the bonding line in a location corresponding to the trench of the upper substrate; and solder formed on the second UBM and melted in the trench by heating to be bonded.

10. The MEMS device package as claimed in claim 9, wherein the upper substrate further comprises a via hole formed therethrough for allowing external electrical connection to the MEMS device.

11. The MEMS device package as claimed in claim 10, wherein the lower substrate further comprises a third UBM formed thereon in a location corresponding to the via hole, and solder formed on the third UBM.

12. The MEMS device package as claimed in claim 11, wherein a fourth UBM is formed inside the via hole, and the solder formed on the third UBM is wetted toward sides of the via hole and bonded by heating.

13. A method of forming a MEMS device package including a lower substrate having a MEMS device formed thereon, and an upper substrate being coupled with the lower substrate to cover the MEMS device, the method comprising:

a) forming a via hole through the upper substrate, and a trench in a contact surface of the upper substrate along a bonding line with the lower substrate;

b) forming a first UBM on the via hole and the trench, respectively;

c) forming a second UBM on portions of the lower substrate corresponding to respective locations of the via hole and the trench;

d) plating solder on the second UBM to have a predetermined thickness;

e) inserting the solder into the via hole and the trench, respectively, so as to couple the upper substrate and the lower substrate; and f) heating the coupled upper substrate and lower substrate so that the solder is melted and bonded.

14. The method as claimed in claim 13, further comprising:

interconnecting the MEMS device through the via hole; and performing an electroless plating by employing the second UBM of the via hole as a seed of the electroless plating so as to fill the via hole.

15. The method as claimed in claim 13, wherein the trench is formed to have a depth such that the solder is completely inserted into the trench in (e).

16. The method as claimed in claim 13, wherein in (b), the first UBM is formed on the via hole and the trench, respectively, such that the solder is wetted toward sides of the via hole and trench, respectively, in the bonding process of (f).

17. The method as claimed in claim 13, wherein the second UBM formed on the portions of the lower substrate is formed to have a width greater than the respective opening of the via hole and the trench.

18. The method as claimed in claim 13, wherein the solder is comprised of a eutectic material having a melting point higher than a processing temperature of a process to be performed after the bonding process of (f).

19. The method as claimed in claim 18, wherein the solder is formed to have a high aspect ratio in the plating of (d).

20. The method as claimed in claim 18, wherein a heating temperature of the bonding process is higher than a eutectic temperature of the solder.

* * * * *